United States Patent [19]

Schulz et al.

[11] 3,879,676

[45] Apr. 22, 1975

[54] PULSE TRAIN FILTER CIRCUIT PARTICULARLY FOR AUTOMOTIVE TACHOGENERATORS

[75] Inventors: Alfred Schulz, Braunschweig; Günther Hönig, Markgroningen, both of Germany

[73] Assignee: Robert Bosch G.m.b.H., Stuttgart, Germany

[22] Filed: July 18, 1973

[21] Appl. No.: 380,368

[30] Foreign Application Priority Data

Aug. 3, 1972 Germany ........................... 2238241

[52] U.S. Cl. ........................ 331/10; 331/17; 331/25

[51] Int. Cl. ............................................... H03b 3/04

[58] Field of Search ........... 331/1 A, 11, 17, 12, 25, 331/10

[56] References Cited

UNITED STATES PATENTS

| | | | |
|---|---|---|---|
| 3,458,823 | 7/1969 | Nordahl | 331/1 A |
| 3,528,026 | 9/1970 | Groendycke | 331/11 |
| 3,703,686 | 11/1972 | Hekimian | 331/11 |
| 3,715,751 | 2/1973 | Mead | 331/1 A |

OTHER PUBLICATIONS

Electronics, G. S. Oshiro, Jan. 22, 1970, p. 83.

Electronic Design, W. L. Gill, Apr. 11, 1968, pp. 76–79.

Electronics, D. Morgan, Sept. 25, 1972, pp. 121, 122.

*Primary Examiner*—John Kominski

*Attorney, Agent, or Firm*—Flynn & Frishauf

[57] ABSTRACT

A voltage controlled oscillator is kept in step with an incoming train of pulses by a phase-locked loop containing a pulse comparator operating as an EXCLUSIVE OR gate followed by a regulating amplifier that partially integrates while also transmitting the signal to the frequency control of the oscillator. Effective phase-locked operation of the oscillator over a wider frequency range or for more rapid frequency changes is provided by an auxiliary control circuit fed by the same input pulses, which integrates the input with a slight delay and acts as a low-pass circuit passing frequencies within the full range of the input pulse repetition frequencies. The phase-locked loop control and the auxiliary control are combined for control of the oscillator frequency either in a simple summing circuit or through a limiter, which gives control to the auxiliary circuit when the frequency changes sharply. The circuit is particularly useful for filtering out irregularities from the signal of a tachogenerator that corresponds to the velocity of a wheel of a motor vehicle, and in this application the circuit can be arranged to yield an acceleration signal as well as a filtered velocity signal.

18 Claims, 9 Drawing Figures

PULSE TRAIN FILTER CIRCUIT PARTICULARLY FOR AUTOMOTIVE TACHOGENERATORS

Figure 1A:
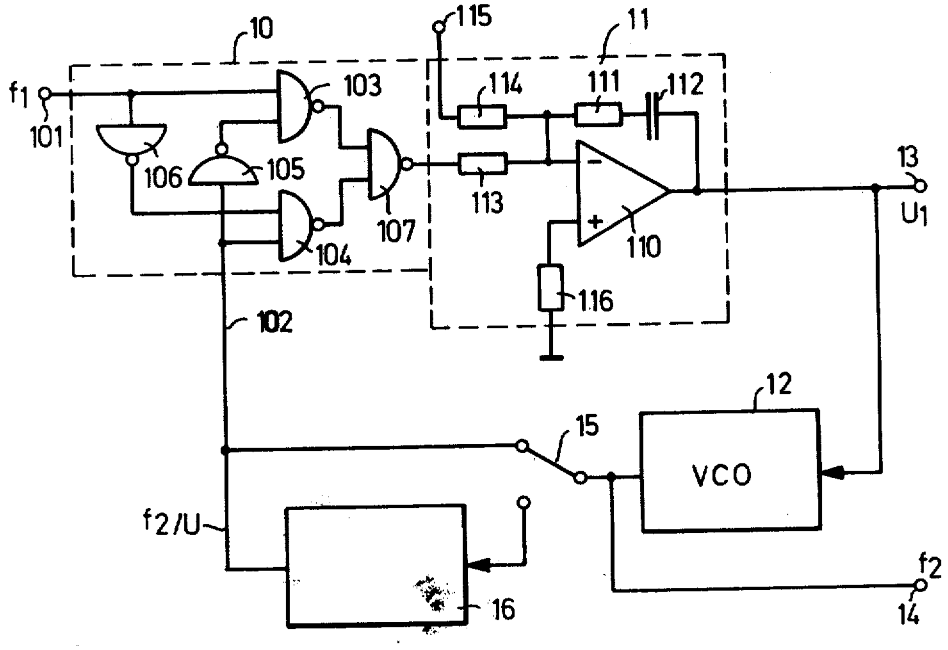

This invention concerns a pulse train filter circuit meeting the requirements for use with automotive tachogenerators, where the pulse frequency of the pulse train has a wide range of variation and where electrical equipment is subject to considerable disturbing influences.

It is often important to utilize the frequency of a pulse train for the operation of a computing circuit in an electronic control circuit for a motor vehicle, whether it be for fuel injection, automatic transmission control or antiblocking brake control. Thus, for example, pulse type rotational frequency detectors or indicators, commonly called tachogenerators, provide a train of pulses at a frequency which is proportional to a rate of rotation which it is desired to measure.

The difficulty usually arises that a disturbance frequency spectrum caused by disturbing influences is superimposed upon the desired pulse train frequency. Thus, the alternating current pulses supplied by a pulse type tachogenerator may be modulated in amplitude and frequency, because the tachogenerator is subjected to mechanical vibrations. Mechanical vibrations of that sort cannot be avoided in motor vehicles. Furthermore, pulse trains that appear at the output of a computing circuit stage may have a disturbance frequency spectrum superimposed, for example, if the time distribution of the pulses is not even. This condition corresponds, likewise, to a phase or frequency modulation of the pulse train.

The disturbance frequency spectra above described reduce the accuracy that can be obtained with a computing circuit designed to operate on the pulse train frequency. It is accordingly an object of the invention to provide a circuit for filtering pulse train frequencies which will enable the desired frequency to be separated as well as possible from disturbance frequency spectra. It is a further object of the invention to provide a circuit with those qualties that is universally applicable in the greatest possible variety of automotive control circuits.

SUBJECT MATTER OF THE PRESENT INVENTION

Briefly, a pulse generating oscillator the frequency of which is voltage controlled is kept in step with an input pulse train by means of a phase regulating circuit which includes a phase comparison for comparing the input pulse train and the output pulses of the oscillator and a regulating circuit through which the output of the phase comparison circuit controls the frequency of the oscillator. Since the original pulse train is caused to generate a new pulse train kept in step with the original pulse train, this circuit may be referred to as a pulse train filter or a pulse train regenerating circuit, for the pulses are produced anew free of irregularities. This type of circuit may also be referred to as a phase locked oscillator circuit. The voltage controlled oscillator transmits pulses at a frequency that, as the result of the balancing of the regulating circuit, is the same as the fundamental wave of the input frequency and is free of any superimposed disturbance frequency spectrum. The phase comparison circuit brings the output frequency of the voltage controlled oscillator exactly to the frequency of the input pulse train.

If the pulse train, provided by a tachogenerator or by some other circuit, is too low for convenient handling in a following computing circuit, the pulse regenerating circuit of this invention can be provided with a frequency dividing circuit between the oscillator output and the input of the phase comparison circuit that is connected to the feedback loop. In this way the output frequency of the voltage controlled oscillator can be made equal to a selected multiple of the input frequency. This circuit is to be distinguished from other frequency multiplication circuits in that the output frequency shows no frequency modulation when the input pulses are unevenly spaced in time.

The output frequency of a tachogenerator used in an anti-blocking brake control system can vary in the ratio 1:40 according to the rate of rotation of the vehicle wheel to which it is connected. The shortcomings of known filter circuits result from the fact that the filter bandwidth must be at least equal to the output frequency range of the tachogenerator. For this reason, disturbance frequencies can be filtered out only, insufficiently by conventional methods.

A narrow band filter for rapidly and widely varying input frequencies can be provided, however, in another form of the invention, by using an auxiliary control circuit containing a low-pass resistance-capacitance circuit to which the same input frequency is provided as to the phase comparison circuit. The output of this auxiliary control circuit, which is to say the output of the low-pass circuit, is caused to contribute to the control of the oscillator. In this arrangement the auxiliary control circuit provides coarse control for the oscillator, and the phase regulation circuit including the phase comparator circuit then takes charge of only the fine adjustment. The bandwidth of the circuit, regarded as a filter, is determined by the phase regulation circuit. It can be substantially smaller than the input frequency range. For example, the pulse tachogenerator may have an output frequency range from 0.1 to 4 kHz, but with the circuit according to this invention a filter bandwidth of 0.1 kHz can be readily obtained. A limiter circuit can be used between the auxiliary and the phase-lock control to give the former control when the signal from the latter exceeds a predetermined value and it may be desirable to vary the limiter threshold with frequency.

Figure 1B:
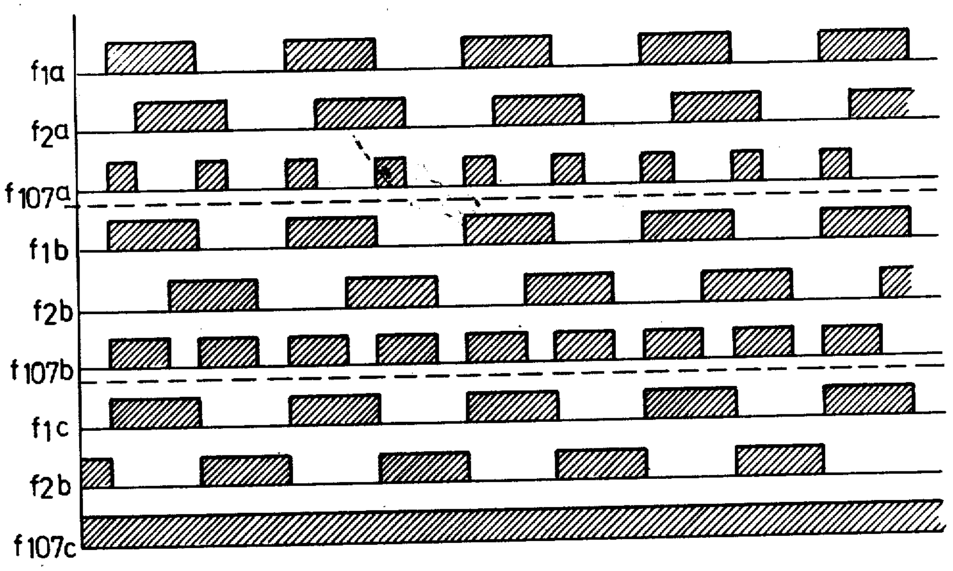
Figure 1C:
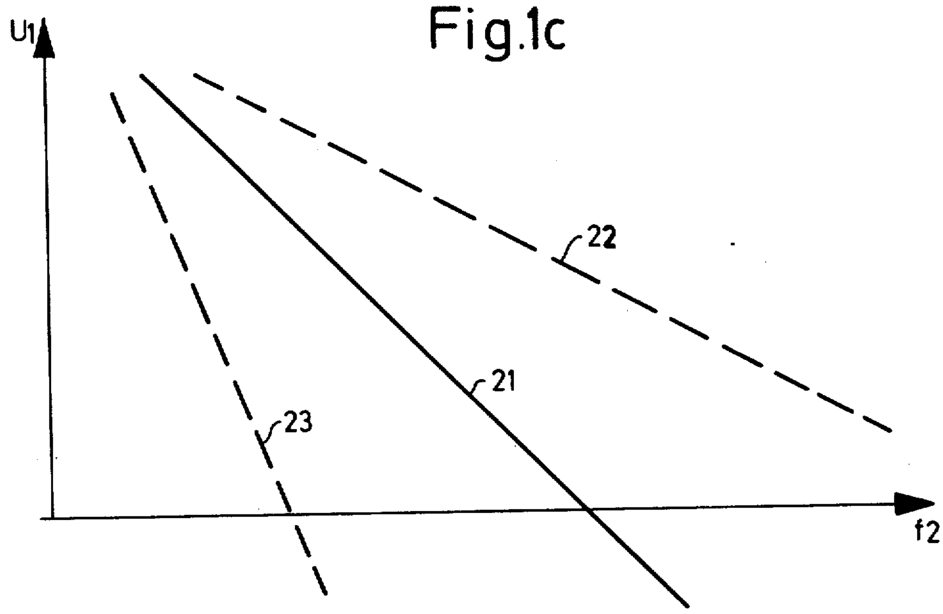
Figure 2:
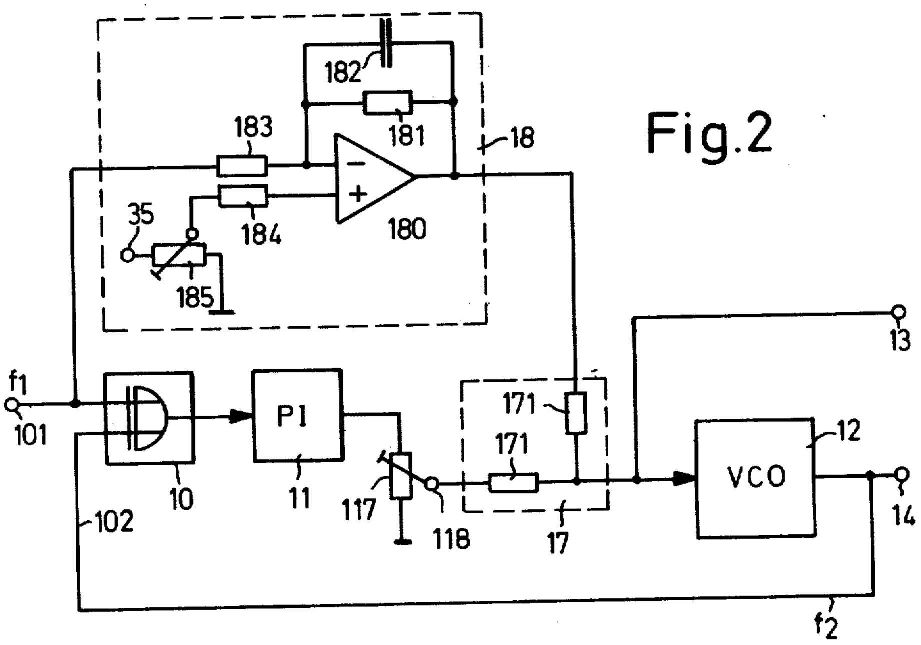
Figure 3A:
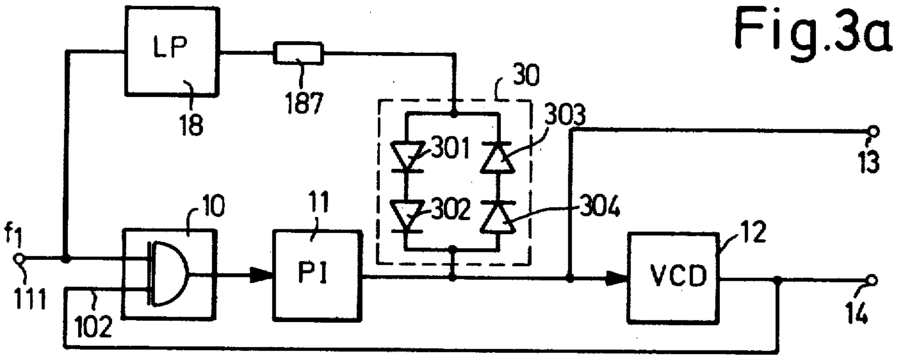
Figure 3B:
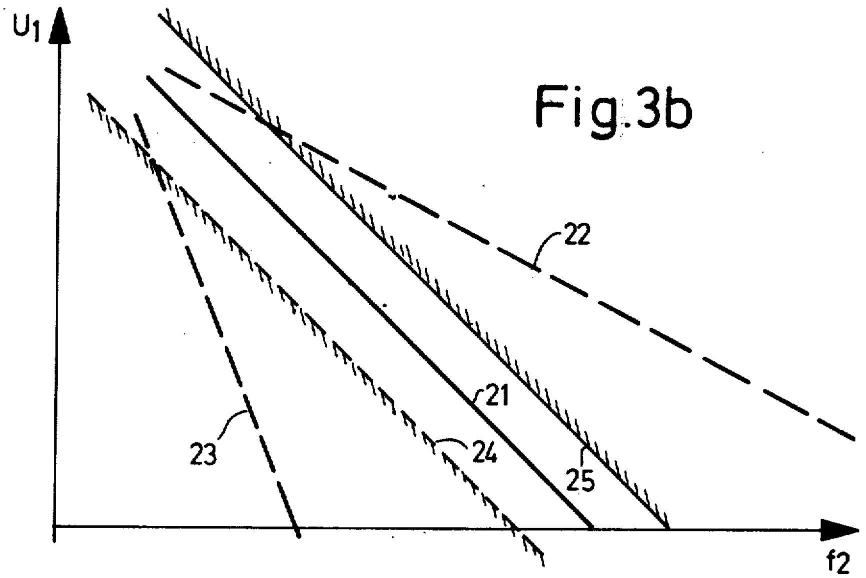
Figure 3C:
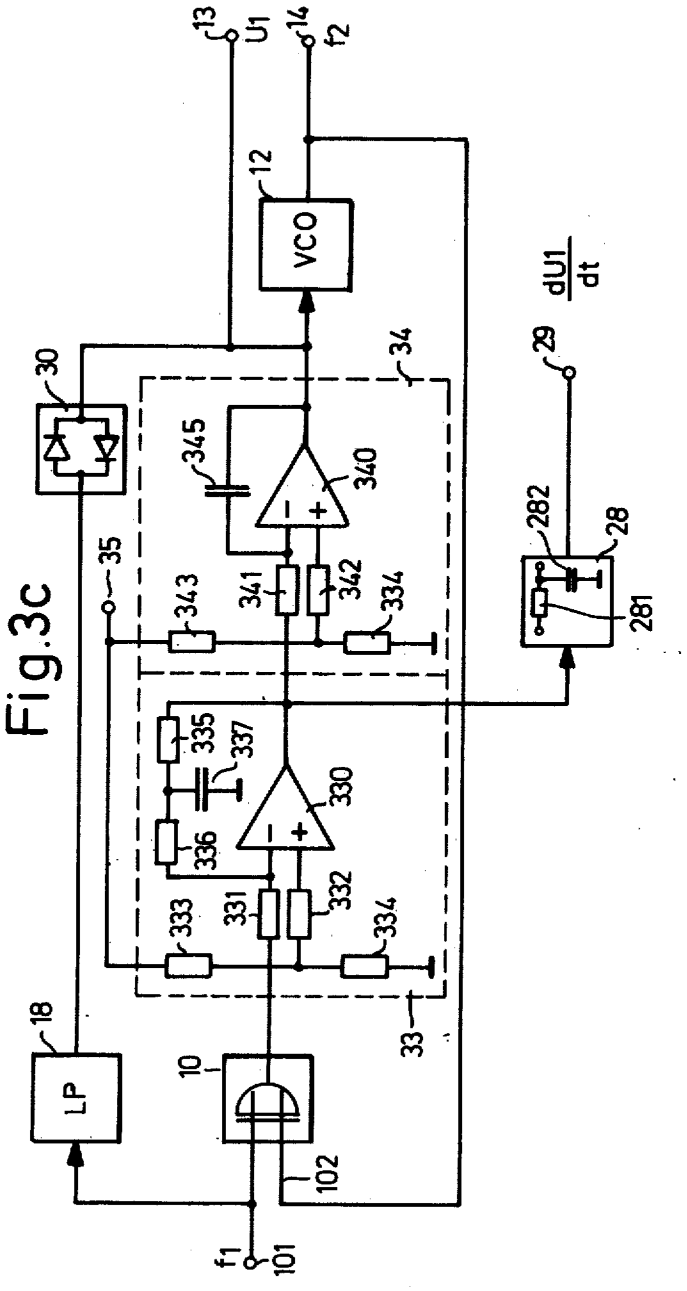
Figure 4A:
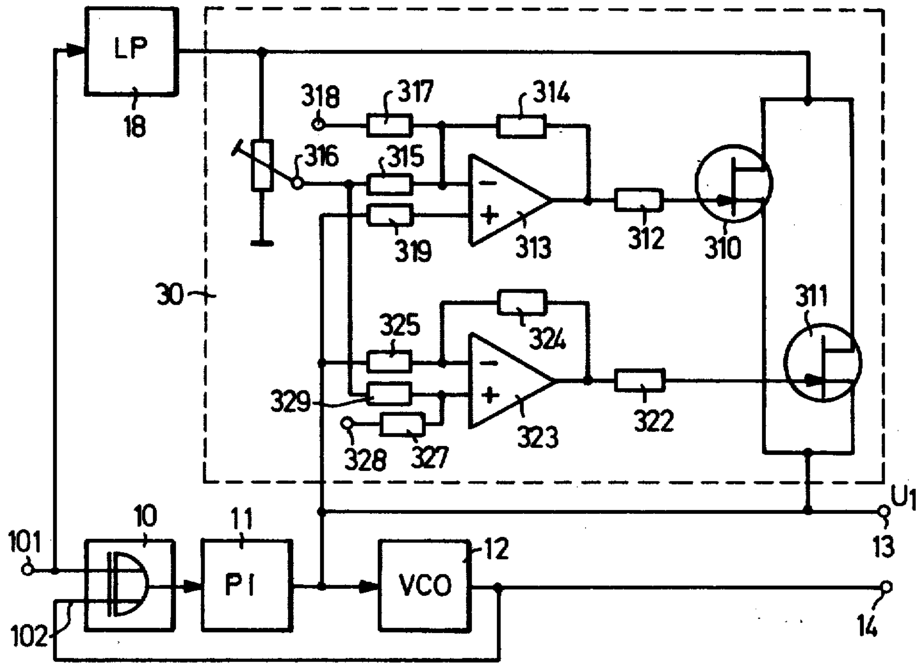
Figure 4B:
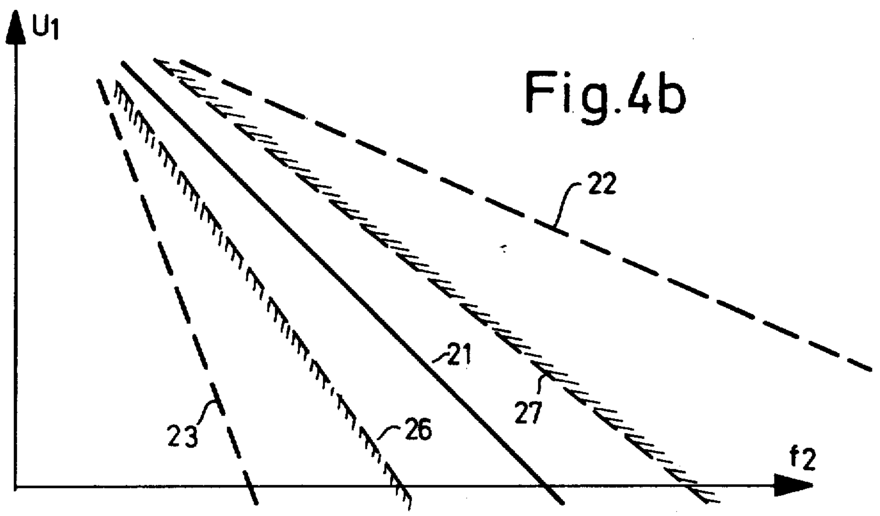

The invention will be described by way of example with reference to the accompanying drawings, wherein:

FIG. 1*a* is a circuit diagram of a first illustrative embodiment of the invention;

FIG. 1*b* is a timing diagram for explaining the operation of the circuit of FIG. 1*a*;

FIG. 1*c* is a voltage-frequency diagram for explaining the operation of the circuit of FIG. 1*a*;

FIG. 2 is a circuit diagram of a second illustrative embodiment of the invention;

FIG. 3*a* is a circuit diagram of a third illustrative embodiment of the invention;

FIG. 3*b* is a voltage-frequency diagram explaining the operation of the circuit of FIG. 3*a*;

FIG. 3*c* is a circuit diagram of a modification of the circuit of FIG. 3*a*;

FIG. 4*a* is a circuit diagram of a fourth illustrative embodiment of the invention; and FIG. 4*b* is a voltage-frequency diagram for explaining the operation of the circuit of FIG. 4*a*.

The first example of an embodiment of the invention is shown in FIG. 1*a*. At its input side there is a phase comparison circuit 10, which is constituted in the form of an EXCLUSIVE OR gate. The input frequency $f_1$ is applied to the input terminal 101, which constitutes the first input of the phase comparison circuit 10. A second input 102 of the phase comparison circuit serves for feeding back a regulated frequency $f_2$. The phase comparison circuit 10 contains two NAND gates 103, 104. The inputs of the first NAND gate 103 are respectively connected to the first input terminal 101 and, over an inverting stage 105, with the second input connection 102. Conversely, the second NAND gate 104 has one input connected over an inverting stage 106 to the first input terminal 101 and another input connected directly to the second input connection 102. The outputs of the NAND gates 103 and 104 are respectively connected to the inputs of a third NAND gate 107, the output of which provides the output of the phase comparison circuit 10.

Following the phase comparison circuit 10 is a regulating circuit 11 that in this first example of an embodiment of the invention is constituted as a proportional-integrating regulator; that is, the transmission characteristic of this circuit has both a proportional and an integrating component. An active component is included in the regulating circuit 11, an operation amplifier 110, with a feedback circuit from its output over a resistor 111 and a series capacitor 112 to the inverting input of the operational amplifier.

The output of the third NAND gate 107 is connected over a resistor 113 to the inverting input of operational amplifier 110. The inverting input of the operational amplifier 110 is also connected over a resistor 114 to a terminal 115. The noninverting input of the operational amplifier 110 is connected to the basic reference potential, such as to the chassis of the vehicle, a connection which may, for short, be referred to as a ground.

The output of the operational amplifier 110 is brought out at the terminal 13 where the frequency control voltage $U_1$ may be taken off. A reference voltage that is negative with respect to chassis or ground is applied to the terminal 115.

The output of the regulating circuit 11, which appears at the terminal 13, is applied to the frequency control connection of the oscillator 12 which is a voltage controlled oscillator. The output of the oscillator 12 is brought out to another terminal 14 where the regulated frequency $f_2$ can be taken off. The output of the oscillator 12 is also furnished to the arm of a switch 15, which in the position shown in FIG. 1*a* supplied the output pulse train over a first contact of the switch 15 to the second input connection 102 of the phase comparison circuit 10. In a second position of the switch 15 the output of the voltage controlled oscillator 12 is connected with the input of a frequency divider 16, the output of which is likewise connected to the second input connection 102 of the phase comparison circuit 10.

The manner of operation of this first example of the invention, and particularly of the phase comparison circuit 10, can best be understood with reference to FIG. 1*b* and to Table 1, set forth below.

Table 1

| $f_1$ | $f_2$ | 103 | 104 | 107 |
|---|---|---|---|---|
| O | O | L | L | O |
| O | L | L | O | L |
| L | O | O | L | L |
| L | L | L | L | O |

The symbols 0 and L designate the two possible binary number conditions. A stage transmits a 0 signal when its output is connected to negative potential; conversely, it transmits an L signal when the output is connected to positive potential. Since the signals $f_1$ and $f_2$ are pulse signals they simply go back and forth between the 0 and L conditions, and the first two columns of Table 1 show the possible value combinations of the signals $f_1$ and $f_2$ applied to the inputs 101 and 102 of the phase comparison circuit.

A NAND gate can transmit a 0 signal only when there are L signals at all its inputs. From this fact are derived the two following columns of Table 1, in which the output signals of the two NAND gates 103 and 104 are given. Finally, in the last column of Table 1 the output signals of the third NAND gate 107 are given for each of the combinations of input signals $f_1$ and $f_2$. This table demonstrates that the output signals of the third NAND gate 107 obey the EXCLUSIVE OR gate function with respect to the inputs to the phase comparison circuit: the NAND gate 107 transmits an L signal only when the two input signals $f_1$ and $f_2$ have different binary values.

FIG. 1*b* is a timing diagram showing the relations of the input signals $f_1$ and $f_2$ and the output signal of the phase comparison circuit $f_{107}$ for three different cases designated *a*, *b*, and *c*, and representing respectively a phase shift of 60°, 120° and 180° between the frequencies $f_1$ and $f_2$. The 60° phase shift case (case *a*) is shown on the top three lines of FIG. 1*b*. The NAND gate 107 in this case transmits pulses of a frequency twice as great as the input frequencies ($f_1$ or $f_2$), they being substantially equal. The keying ratio, or duty cycle, defined as the ratio of pulse length to repetition, in this case has the value of 0.33.

When the phase difference between the frequencies $f_1$ and $f_2$ is 120° (case *b*) the frequency of the output pulses of NAND gate 107 is of the same magnitude as in case *a*, but the keying ratio is now 0.66. At 180° phase difference (case *c*) the NAND gate 107 finally transmits a continuous L signal, for the keying ratio has now become 1.0, which will happen when the keying ratio of the original signals $f_1$ and $f_2$ are at least 0.5.

It can thus be seen from FIG. 1*b* that the keying ratio of the output pulses of the third NAND gate 107 are proportional to the phase difference between the two frequencies $f_1$ and $f_2$. As the result of the series combination of the resistor 111 and the capacitor 112 in the negative feedback path of the operational amplifier 110, the regulating circuit 11, to which the output of the NAND gate 107 is supplied, operates both to integrate the signal and to reproduce it proportionally. As the result of the integrating effect, there is formed at the output of the regulating circuit 11 the time integral of the output pulses provided by the NAND gate 107. The proportional effect of the circuit passes a signal component through the circuit in the form of pulses that are superimposed upon the relatively steady voltage produced by integration. The purpose of including a pulse component in the output is that this enables changes in the input frequency $f_1$ to be detected more quickly. The proportional effect must not be too great, however, since the output voltage $U_1$ of the operational amplifier 110 should not be too wavy.

The output voltage $U_1$ of the operational amplifier 110 which, as just mentioned, is a d.c. voltage with a quite weak ripple superimposed, can be taken off at the terminal 13. This voltage is also applied to control the frequency of the voltage controlled oscillator 12. Such voltage controlled oscillators are currently manufactured in the form of integrated circuit components. To use them it is necessary only to set the frequency region of the oscillator by adding an external capacitor to the unit. The output voltage $U_1$ of the regulating circuit and the frequency range of the voltage controlled oscillator 12 must be so fitted to each other that the output frequency of the voltage controlled oscillator 12 is approximately equal to the input frequency $f_1$.

The solid line 21 in FIG. 1*c* shows the linear dependence of the frequency $f_2$ on the voltage $U_1$. In this case it is assumed that the voltage controlled oscillator 12 is locked to the fundamental frequency of the input frequency $f_1$. The phase comparison circuit 10 can also give pulse trains with constant keying ratio, however, if the voltage controlled oscillator 12 operates at a frequency that is an harmonic (overtone) or a subharmonic of the input frequency $f_1$. Synchronism with the first subharmonic is shown in FIG. 1*c* with the dashed line 22, whereas the dashed line 24 shows the relationship in the case of synchronism with the first harmonic.

Case must be taken that the voltage controlled oscillator 12 always begins oscillating at the fundamental frequency. The arrangement of FIG. 1*a*, the first example illustrating this invention, should therefore preferably be adjusted so that the input frequency $f_1$ can vary only in a relatively narrow range, so that no capture problem (lock-in problem) arises.

It is advantageous, further, to set the normal phase shift of the output frequency $f_2$ of the voltage controlled oscillator 12 with respect to the input frequency $f_1$ at exactly 90°. A phase shift range of 90° in either direction is then available for changes of the input frequency, or rather a phase shift of 90° in either direction is available for the phase error that can be allowed, before the voltage controlled oscillator 12 falls out of step by one period. To set the constant normal phase shift of 90°, a reference voltage is applied to the terminal 115 connected to the inverting input of the operational amplifier 110.

The circuit of FIG. 1*a* constitutes a phase regulation circuit commonly known as a phase locked loop. The output frequency $f_2$ of the voltage controlled oscillator 12 is precisely held at the value of the input frequency $f_1$, because the circuit responds to deviations in the phase difference between the two frequencies $f_1$ and $f_2$. The two frequencies thus do not have to be measured by counters and compared with each other.

In the phase locked circuit of FIG. 1*a*, the forward branch is constituted of the phase comparison circuit 10 and the regulating circuit 11. In the feedback branch there is the voltage controlled oscillator 12, which constitutes a voltage-to-frequency converter. The closed regulating circuit must thus operate as a frequency-to-voltage converter. It follows, thus, that the output voltage $U_1$ of the regulating circuit 11, apart from transient response, is exactly proportional to the input frequency $f_1$. The transient response of the regulating path is determined by the regulating characteristic of the regulating circuit 11.

If the changeover switch 15 of the circuit of FIG. 1*a* is moved over to its second position, the output frequency of the voltage controlled oscillator 12 is divided in the divider circuit 16. The output frequency of the divider circuit 16 is equal to $f_2/2$, where $u$ is the division factor. The voltage controlled oscillator 12 then oscillates at the $u$-th harmonic of the input frequency $f_1$. In this case at the terminal 14 a frequency $f_2$ can be taken off which is multiplied by the division factor $u$ with respect to the input frequency $f_1$.

It is desirable for the pulses of the input frequency $f_1$ and the pulses provided by the dividing circuit 16 to be of equal length, so the dividing circuit should preferably not simply suppress some of the output pulses of the oscillator 12, unless the input pulses have a low enough keying ratio so that their duration is comparable to that of the output pulses of the oscillator 12 at the higher frequency. If the input pulses have a keying ratio near 0.5, the dividing circuit 16 should preferably likewise furnish its output pulses at a similar keying ratio. The keying ratio of 0.5 for $f_1$ and $f_2$, as shown in FIG. 1*b*, provides maximum sensitivity of the phase regulation, since the NAND gate 107 goes from a continuous 0 signal for a 0 phase difference to a continuous L signal for a 180° phase difference.

A further advantage of the phase regulation circuit of FIG. 1 should be mentioned here: if the individual pulses of the input frequency $f_1$ are unevenly distributed in time, the phase regulation circuit has the effect of filtering the fundamental wave. The output pulses of the voltage controlled oscillator 12 are then evenly distributed in time, and the disturbance frequency spectrum of the input frequency $f_1$ is suppressed. Such input pulse trains with pulses unevenly distributed in time, can for example be produced when the frequency $f_1$ represents the calculation result of a digital increment computing circuit. In that case the average number of pulses per unit of time remain constant, but the individual pulses do not follow equidistantly one after another.

Whereas the first example of this invention shown in FIG. 1*a* can be used primarily when the input frequency $f_1$ can vary only over a narrow frequency range, the illustrative embodiments of the invention given below with reference to FIGS. 2, 3*a*, 3*c* and 4 are suited to provide filtering, even for input pulse trains having a wide frequency variation.

In the second embodiment illustrating the invention, shown in FIG. 2, the output of the regulating circuit 11 has an amplitude adjustment potentiometer 117 connected between its output and ground. The tap 118 of this trim potentiometer 117 is connected to a first input of a summing circuit 17. The output of a low pass auxiliary regulating circuit 18 is connected to the second input of the summing circuit 17. The summing circuit 17 is constituted by two resistors 171 and 172, which provide for a signal adding effect. The common connection of the resistors 171 and 172 provides the output of the summing circuit 17, while the other extremities of the resistors provide the input connections.

The output of the summing circuit 17 is connected both to the output terminal 13 and to the frequency control input of the voltage controlled oscillator 12. The circuit arrangement of the voltage controlled oscillator 12 or the phase comparison circuit 10 and the regulating circuit 11 is the same as in the first example of the invention shown in FIG. 1*a*.

The low pass circuit 18 provides the coarse frequency control for the voltage controlled oscillator 12. The input frequency $f_1$ is converted in the low pass circuit 18 into a steady voltage, which is proportional to a time average of the input frequency. The low pass circuit 18 is to be so dimensioned electrically that its passband will include the entire frequency range over which the input frequency $f_1$ may vary. By the auxiliary control provided through the low pass circuit 18, an approximate value of the input frequency $f_1$ is provided to the summing circuit 17 in the form of a d.c. voltage. In this way coarse value for the output frequency $f_2$ of the voltage controlled oscillator 12 is already provided without regard for the phase locked loop. The regulating circuit 11 now needs to regulate only a small remaining error, in order to establish synchronization in the phase regulation circuit. The regulating circuit 11 can then operate at high sensitivity, that is it can operate with considerable amplification. The modulation range of the regulation circuit in response to phase error can be adjusted by the trim potentiometer 117. Even with small phase changes of the input frequency $f_1$, the amplifying regulation circuit 11 responds with a great change in its output voltage.

Taking account of the magnitude of the frequency deviation which the regulating circuit 11 is required to handle, the regulating circuit 11 should be so dimensioned electrically that the maximum usable phase deviation in the phase comparison circuit should bring the regulating circuit 11 close to its output modulation limits. The voltage divider constituted by the trim potentiometer 117 is so adjusted that the voltage values at the output of the summing circuit can never cause the oscillator to lock on a harmonic or subharmonic of the input frequency. The voltage controlled oscillator 12 is thus always held to the fundamental frequency of the input frequency $f_1$ by the auxiliary control provided by the low pass circuit 18.

Particularly upon switching the circuit on, it can often happen that the voltage controlled oscillator 12 will lock on to a subharmonic or a harmonic of the input frequency $f_1$. This is possible because the low pass circuit 18 has a relatively large time delay. After this delay period has run, however, the output frequency of the low pass circuit 18 is in any event proportional to the input frequency $f_1$. The control voltage applied to the voltage controlled oscillator 12 is then pulled to a value that is at least approximately proportional to the output frequency $f_1$. Consequently, after the passing of this delay period of the low pass circuit 18, the voltage controlled oscillator 12 will be pulled over by force into synchronism with the fundamental wave of the input frequency $f_1$.

The auxiliary control circuit containing the low pass circuit 18 must also take over control when the input frequency $f_1$ changes sharply in a short time. Because of its large amplification factor, the regulating circuit 11 could in such a case actually shift the control voltage of the voltage controlled oscillator 12 so far that it might, for example, lock on to the second harmonic (first overtone) of the fundamental frequency. The characteristic delay period of the low pass circuit 18 must be so determined that even in the fastest input frequency changes that are likely to occur, the voltage controlled oscillator 12 will not fall out of step.

In the case of the third illustrative embodiment of the invention, which is shown in FIG. 3*a*, the output of the regulating circuit 11 is again connected directly with the input of the voltage controlled oscillator 12. The rest of the circuits in the phase locked loop, including the phase comparison circuit 10 and a connection to the output terminal 13 are the same as in the first two illustrative embodiments (FIG. 1*a*, FIG. 2). The low pass circuit 18 again has its input connected to the first input terminal 101 of the phase comparison circuit 10. The output of the low pass circuit 18 is in this case connected over a resistor 107 to a limiting circuit 30, through which it connects to the connection between the output of the regulating circuit 11 and the frequency control connection of the oscillator 12. The limiting circuit 30 comprises two parallel series chains of two diodes each (301, 302 and 303, 304 respectively) connected in parallel, or rather anti-parallel, since the chains are directed in opposite polarity.

In the case of the third illustrative embodiment of the invention, shown in FIG. 3*a*, the phase regulation loop containing the stages 10, 11 and 12 normally operates in exactly the same way as in the first embodiment, which was described in connection with FIG. 1*a*. With small variations of the input frequency $f_1$, the phase comparison circuit 10 detects a change in phase difference. The phase regulating circuit 11 then pulls the frequency of the voltage controlled oscillator just enough to bring it back into equality with the input frequency $f_1$.

The regulating circuit 11 in this case, as in the second example, is so dimensioned that it operates at high gain. Phase regulation is thereby made more accurate and faster. It can happen, however, that the input frequency $f_1$ might change rather quickly by a large amount. The output signal of the regulation circuit 11 will then, on account of the high gain, change so sharply that in some circumstances the voltage controlled oscillator 12 will fall out of step and lock on to a harmonic or a subharmonic of the input frequency $f_1$.

The above problem is avoided by auxiliary control with the low pass circuit 18 and the limiter circuit 30. The output voltage of the low pass circuit 18, as previously mentioned, follows the change in the input frequency $f_1$, but does so with some delay. The voltage range over which the output voltage of the regulating circuit 11 deviates from the output voltage of the low pass circuit 18 is determined by the number of diodes in the two diode chains 301, 302 and 303, 304, with the limiting circuit 30. In the case of FIG. 3*a*, there are two diodes in each series chain. When silicon diodes are used, this results in a threshold voltage of 1.4V in each direction, by which the two output voltages may differ from one another without causing the diodes of one of the diode chains to conduct.

A sharp change in the input frequency $f_1$ causes this threshold voltage to be exceeded. When that happens the output voltage of the regulating circuit 11 can no longer affect the control voltage of the voltage controlled oscillator 12. Its frequency is then determined only by the auxiliary control circuit, and for the time being the regulating circuit 11 no longer exerts control. This effect is shown in FIG. 3*b* by the lines 24 and 25. These lines run parallel to the solid straight line 21, which is the control characteristic when the oscillator is locked to the fundamental wave. The frequency region outside of the stripe enclosed by the two lines 24 and 25 is forbidden to the oscillator 12 by the operation of the auxiliary control circuit. From FIG. 3*b* it can be seen that the oscillator 12 can be caused by circumstances to fall out of step only at very low frequencies.

When the auxiliary control circuit composed of the low-pass circuit 18 and the limiting circuit 30 takes over control, the output frequency of the oscillator 12 then varies only slowly, with a velocity which is determined by the upper frequency limit of the low-pass circuit 18. As soon as the oscillator 12 is brought around enough by the operation of the auxiliary control circuit, the voltage difference between the outputs of the stages 11 and 18 is sufficiently reduced that the diodes of the limiter circuit 30 are again all blocked. The phase regulation then again operates with full accuracy.

The distance from the line 24 or the line 25 to the line 21 is determined by the number of diodes connected in each series chain of the limiting circuit 30. The smaller the number of diodes 301 to 304, the smaller will be the permissible region of the output voltages of the regulating circuit 11 and the more secure will be the capture or lock-on behavior of this form of embodiment of the invention shown in FIG. 3*a*.

FIG. 3*c* shows a modification of the third illustrative embodiment of the invention which can also serve to differentiate the input frequency $f_1$. In this modification the regulation circuit 11 is divided into two parts one following the other, namely a so-called PD regulating circuit 33 and an integrating regulating circuit 34. The PD regulating circuit 33 has a "proportional" effect of transmitting the input signal proportionally and a "differential" effect of providing an output proportional to the rate of change of the input signal. In other respects the circuit comprising the phase comparison circuit 10, the low-pass circuit 18, the limiting circuit 30 and the voltage controlled oscillator 12 is the same as in FIG. 3*a*.

The PD regulating circuit 33 comprises an operational amplifier 30 with its inverting input connected over a resistor 33 to the output of the phase comparison circuit 10. The inverting input of the operational amplifier 330 is also connected over a resistor 332 to the tap of a voltage divider composed of two resistors 33 and 334 and connected between the positive voltage terminal 35 and ground. A series connection of two resistors 335 and 336 is provided in the negative feedback path of the operational amplifier 330, and the common connection of the two resistors 335 and 336 is connected to a capacitor 337 the other side of which is connected to ground. The characteristics of this feedback circuit determine the regulating characteristic of the circuit.

The integrating regulator circuit 34 employs the operational amplifier 340 as its active component. The inverting input of the operational amplifier 340 is connected over a resistor 341 to the output of the operational amplifier 330. The noninverting input of the operational amplifier 340 is connected over a resistor 342 to the tap of a voltage divider consisting of the two resistors 343 and 344 connected between positive voltage and ground. An integration capacitor 345 is connected between the output and the inverting input of the operational amplifier 340.

At the output of the operational amplifier 330 of the PD regulator 33, a branch connection is made to a smoothing stage 28 which contains a low-pass circuit (for example an RC section). The low-pass circuit in this case consists of a resistor 281 and a capacitor 282. The output of the smoothing stage 28 is connected to an output terminal 29.

The provision of a partially integrating circuit 11 (that is, a PI regulator) by a cascade succession of a partially differentiating circuit 33 (PD regulator) and an integrating circuit 34 (I regulator) is a known device used in the design of control systems. The nature of the operation can be verified by addition of the transmission functions of these successive stages. In the case of the PD regulator 33 the regulation characteristic has proportional and differential components, whereas the I regulator 34 has a purely integrating regulating characteristic. The differential component D in the regulation characteristic of the PD regulator 33 is produced by the capacitor 337. If the input frequency to the operational amplifier 330 makes a jump-like change, the capacitor 337 then short circuits the feedback path 335, 336. The change in input voltage is then transmitted at full amplification to the output of the operational amplifier 330. As soon as the capacitor 337 is charged to the new voltage value, the resistors 335 and 336 operate as feedback resistors of a proportional transmission circuit.

In the integrating circuit 34 the integrating capacitor 345 is charged the faster, the more the input voltage of the inverting input of the operational amplifier 340 deviates from the tap voltage of the voltage divider 343, 344. The maximum charge voltage is limited by the magnitude of the supply voltage. By adjustment of one of the two voltage dividers 333, 334, or 343, 344, the desired correction voltage for obtaining a constant normal phase shift of 90° can be set.

It has already been explained in connection with the first illustrative embodiment of the invention that the output voltage $U_1$ of the regulating circuit 11, which corresponds to the output voltage of the corresponding regulating circuit 33, 34 is exactly proportional to the input frequency $f_1$. Because in the circuit of FIG. 3*c* the stage 34 operates as a pure integrating circuit, there must be a voltage at the output of the PD regulator 33 that must equal the first derivative with respect to time of the input frequency $f_1$. This voltage is actually integrated in the stage 34 to produce the voltage $U_1$.

The smoothing stage 28 is desirable, because the output voltage of the operational amplifier 330, on account of the differential component of its regulation characteristic, will contain voltage peaks. These voltage peaks are smoothed out in the low-pass filter 281, 282. The time constant of the smoothing stage 28 must be so chosen that at the terminal 29 a voltage can be obtained that is smoothed as well as possible, but at the same time is able to detect the fastest occurring changes in the input frequency $f_1$.

The output voltage of the integrating circuit 34 is limited by the limiting circuit 30. The diodes 301 to 304 also limit the differentiator output signal obtained at the terminal 29. That is, as soon as the auxiliary control circuit with the low-pass circuit 18 and the limiting circuit 30 takes hold, the integrating circuit 34 is no longer in control and the PD regulator 33 also no longer gives a signal that is exactly proportional to the first derivative of the input frequency $f_1$. If large derivative values (differential quotients) are to be reliably measured, a larger number of limiting diodes 301 . . . 304 must be connected in series. From FIG. 3*b* it may be observed that the range of frequency over which the oscillator 12 will be reliably locked to the fundamental wave of the input frequency $f_1$ is then reduced. If difficulties are found in the choice of a favorable compromise value for the operating range of the limiting circuit 30, it is then necessary to go to the fourth illustrative embodiment of the invention shown in FIG. 4*a* for a suitable design of the limiting circuit 30.

This fourth example shown in FIG. 4*a* differs from the third example shown in FIG. 3*a* only in the composition of the limiting circuit 30. In this case two field effect transistors 310 and 311, with their drain-source paths connected in parallel, are provided in the limiting circuit 30 between the output of the low-pass circuit 18 and the output 13 of the regulating circuit 11. The gate electrode of the first field effect transistor 310 is connected over a resistor 312 with the output of an operational amplifier 313. Transmission gates of the type CD 4076 (produced by RCA) may be used as field effect transistors 310,311. The operational amplifier 313 is provided with a negative feedback path by a resistor 314 connected from the output to the inverting input. The inverting input of the operational amplifier 313 is further connected over a resistor 315 to the tap of a trim potentiometer 316, the other terminals of which are connected between the output of the low-pass circuit 18 and ground, so as to provide an amplitude adjustment. Another connection from the inverting input of the operational amplifier 313 goes over a resistor 317 to a terminal 318 to which a reference voltage is applied. The noninverting input of the operational amplifier 313 is connected over a resistor 319 to the output 13 of the regulating amplifier 11.

The gate electrode of the second field effect transistor 311 is connected over a resistor 322 with the output of another operational amplifier 323. The latter is provided with negative feedback by the resistor 324. The inverting input of the operational amplifier 323 is connected over a resistor 325 to the output 13 of the regulating circuit 11. The noninverting input of the operational amplifier 323 is connected over a resistor 329 with the tap of the trim potentiometer 316. Finally, another resistor 327 is connected between the noninverting input of this amplifier to a terminal 328 which likewise is connected to a reference voltage.

The two operational amplifiers 313 and 323 operate as threshold switches, which determine a permissible deviation in either direction between the respective output voltages of the stages 18 and 11. It is at first sight surprising that the operational amplifiers 313 and 323 are provided with negative feedback by the respecitve resistors 314 and 324. This negative feedback is necessary, however, because there is a strong feedback over the field effect transistors 310 or 311. The negative feedback resistors 314 and 324 must therefore be of such values that exactly the desired switching hysteresis is provided for the threshold switches 313 and 323.

In the case of an excessively large deviation between the output voltages of the stages 11 and 18, one of the threshold switches 313, 323 will respond, according to the direction of the deviation. The switch that operates will change its output potential in the positive direction to such an extent that the field effect transistor associated with it, 310 or 311, will be made conducting. In consequence, as in the third example (FIG. 3*a*), the output of the low-pass circuit 18 will be connected with the frequency control input of the voltage controlled oscillator 12. It is important in this case that the variable output voltage of the low-pass circuit 18 is utilized as a reference voltage for the two threshold switches 313 and 323. On this account the limiting characteristic of the circuit is as shown in FIG. 4*b*, instead of being like that of the third example (FIG. 3*b*). At high frequencies the output voltage of the low-pass circuit 18 is higher, so that a switching threshold of the threshold switches 313 and 323 is at a value that is further removed from the solid straight line 21. The line 21 in FIG. 4*b* is enclosed by two lines 26 and 27, which indicate the boundaries of the regulating region. The two lines 26 and 27 become further apart and therefore read further from the line 21, the higher is the frequency $f_2$. Thus, the regulation region at high frequencies is greater and at low frequencies it is smaller. It may be seen from FIG. 4*b* that the lines 23, 26, 27 and 22 nowhere intersect within the frequency region of interest. Consequently, in this fourth illustrative embodiment of the invention, the permissible range of input frequencies $f_1$— the so-called capture range — is greater than in the third example. In this fourth example it is quite impossible for the oscillator 12 to lock on to a subharmonic or on to a harmonic of the fundamental frequency, even at low values of the frequency $f_1$.

This fourth illustrative embodiment of the invention can also be provided with a differentiating function, if in accordance with FIG. 3*c* the regulating circuit 11 is made up of a PD regulator 33 and an integrating regulator 34 and the smoothing stage 28 is provided in the branch output of the PD regulator 33. All of the illustrative embodiments above described can also be used as frequency multipliers if a frequency division circuit 16 is interposed between the oscillator 12 and the second input of the phase comparison circuit 10 as shown in FIG. 1*a*.

Now that the operation of all four illustrative examples has been explained, the particular fields of application of the circuit arrangement of the invention in the general area of motor vehicle electronics should be set forth. It is frequently required to derive, from the output pulses of a tachogenerator, a d.c. voltage the magnitude of which is range. For to the rate of rotation to be measured. The output frequencies of the tachogenerator can in such a case vary over a very wide range.- For this application, therefore, the embodiments constituted according to FIG. 2, FIG 3 or FIG. 4 are particularly suitable because of the provision in these cases of an auxiliary coarse control. Rotation speed measurement can be important in the control of fuel injection systems, of ignition timing and of electronically controlled transmission systems. Electrohydraulic control circuits for the intake and exhaust valves of internal combustion engines also operate on input signals that are related to the rotation speed of the engine.

Pulse tachogenerators of the type here discussed are, finally, also used in antiblocking control systems for vehicle brakes. In an antiblocking control system it is necessary to have acceleration signals, that is, d.c. voltages that are proportional to the rate of speed change (first derivative of wheel velocity) with respect to time. The last two illustrative embodiments, illustrated in FIG. 3 and FIG. 4, are accordingly suitable for this purpose. The circuit system in accordance with this invention is actually particularly advantageous for antiblocking control systems, because pulse tachogenerators mounted on the vehicle wheels are exposed to unusually great mechanical loads as the vehicle drives across uneven street surfaces. As the result of these mechanical loads the amplitude, for example, of the output voltage of a pulse tachogenerator can change. Such an amplitude modulation of the pulse transmitter output signal produces superimposed disturbance frequencies that change sharply with time. In conventional circuits for evaluating and differentiating a pulse transmitter output, an acceleration signal can in this manner be falsely simulated in the differentiator by a signal that is in fact caused only by the disturbance frequency spectrum. In this situation the circuit of the present invention operates particularly well, for the filter bandwidth which is given by the lines 24 and 25 of FIG. 3*b* or 26 and 27 of FIG. 4*b* can be made very narrow. Furthermore, when the phase regulation loop is used with auxiliary control, the midfrequency of the filter is shifted along with the input frequency $f_1$. This also is to be seen from FIG. 3*b* and FIG. 4*b*. The example given in the introduction of an input frequency variable between 0.1 and 4 kHz that can be filtered with a bandwidth of 0.1 kHz, can now be understood with reference to FIGS. 3*b* and 4*b*. Conventional filter circuits by contrast, must allow the entire input frequency range from 0.1 to 4 kHz to pass, so that they are much less able to attenuate the disturbance frequency spectrum.

A further important field of application for the circuit arrangement of the invention is found in the filtering of output frequencies of computer circuits. It has for example already been proposed to use a digital increment computer circuit for control of a fuel injection system or for setting the ignition timing of an internal combustion engine. Individual stages of the digital increment computer circuit provide output frequencies the individual pulses of which are unevenly distributed in time, although the average number of pulses per unit of time, i.e., the pulse train frequency, has a definite value. This nonuniform distribution corresponds to a frequency or phase modulation of the operating frequency. The disturbance frequency spectrum resulting from this effect can likewise impair calculation accuracy of the following stages of the computer circuit. All four of the illustrative embodiments here described make it possible to obtain strictly periodic pulse train frequencies $f_2$ from such input frequencies $f_1$ with nonuniformly distributed pulses. For the case in which the output frequency of one stage of the computing circuit has so low a value that it is no longer suitable for further operations, the frequency multiplying circuit utilizing the divider circuit 16 applied to any of the four embodiments here illustrated can be used. Compared to conventional frequency multiplying circuits, the additional advantages here obtained is that an input frequency $f_1$ with nonuniformly distributed pulses can be converted into a strictly periodic multiplied output frequency.

Although the invention has been described with respect to particular embodiments, it will be understood that other variations and modifications may be made within the inventive concept without departing from the spirit of the invention.

What is claimed is:

1. A pulse train filter circuit for a pulse train of varying frequency comprising:

a phase comparison circuit (10) having a first input for receiving an input pulse train and a second input (102) for receiving an output pulse train;

a pulse train generating oscillator (12) of voltage controlled frequency for supplying an output pulse train to an output circuit and to said second input (102) of said comparison circuit (10);

a regulating circuit (11) having its input connected to the output of said comparison circuit (10) and its output connected for frequency control of said oscillator (12), for converting the output of said comparison circuit (10) to a control voltage of suitable characteristics and magnitude range for causing the output pulses of said oscillator (12) to keep in step with pulses of said input pulse train, and an auxiliary control circuit for increasing the capture range of the frequency control of said oscillator, containing a low-pass circuit (18) to which is supplied the same input frequency ($f_1$) as said comparison circuit (10), said auxiliary control circuit (18) continuously furnishing a control voltage of constant polarity to which the frequency control of said output (12) is responsive in addition to being responsive to the output of said regulating circuit (11).

2. A pulse train filter circuit as defined in claim 1, in which said phase comparison circuit (10) has the characteristics of an EXCLUSIVE OR gate.

3. A pulse train filter circuit as defined in claim 1, in which a frequency division circuit (16) is interposed between the output of said oscillator (12) and said second input (102) of said comparison circuit (10).

4. A pulse train filter circuit as defined in claim 1, in which the frequency control of said oscillator is connected to the output of a summing circuit (17), the two inputs of which are connected respectively to said low-pass circuit (18) and to said regulating circuit (11).

5. A pulse train filter circuit as defined in claim 4, in which an amplitude control means (117) is interposed between at least one of the inputs of said summing circuit (17) and the preceding circuit (11 or 18) that supplies a voltage signal to such input of said summing circuit (17).

6. A pulse train filter circuit as defined in claim 1, in which a limiting circuit (30) is interposed between the output of said low-pass circuit (18) and the frequency control of said oscillator (12) for limiting the extend to which the frequency control voltage of said oscillator may be caused by said regulating circuit (11) to deviate from the output voltage of said low-pass circuit (18).

7. A pulse train filter circuit as defined in claim 6, in which said limiting circuit (30) contains at least two diodes (301, 303) in antiparallel connection.

8. A pulse train filter circuit as defined in claim 7, in which said limiting circuit (30) comprises two series chains each of a plurality of diodes (301, 302, 303, 304), said chains being combined in antiparallel connection.

9. A pulse train filter circuit as defined in claim 1, in which a limiting circuit is interposed between the output of said low-pass circuit (18) and the frequency control of said oscillator (12) for limiting the extent to which the frequency control voltage of said oscillator may be caused by said regulating circuit (11) to deviate from the output voltage of said low-pass circuit (18), said limiting circuit comprising two parallel-connected semiconductor switching devices (310, 311), the respective control electrodes of said semiconductor switching devices (310, 311) being each connected with a voltage sensitive threshold switch (311, 232).

10. A pulse train filter circuit as defined in claim 9, in which said semiconductor switching devices (310, 311) are field effect transistors.

11. A pulse train filter circuit as defined in claim 9, in which both of said voltage sensitive threshold switches (313, 323) comprise operational amplifiers having differential inputs, each of said operational amplifiers having one input connected with the output of said regulating circuit (11) and another input connected with the output of said low-pass circuit (18).

12. A pulse train filter circuit as defined in claim 11, in which an amplitude adjusting means (316) is interposed between at least one of the inputs of said operational amplifiers (313, 323) and the output of the stage (18, 11) supplying an electrical signal thereto.

13. A pulse train filter circuit as defined in claim 1, in which said regulating circuit (11) comprises an operational amplifier (110) arranged to provide regulation in a combined proportional-integral mode by virtue of a resistor (111) and a capacitor (112) connected in series to provide a negative feedback path for said operational amplifier (110).

14. A pulse train filter circuit as defined in claim 13, in which means are provided for applying a constant correction voltage to said operational amplifier (110) of said regulating circuit (11) for setting a constant phase difference in the phase regulation applied to said oscillator (12) by said phase comparison circuit (10) and said regulating circuit (11).

15. A pulse train filter circuit as defined in claim 1, in which said regulating circuit (11) is provided in a form having a combined proportional and integral regulating characteristic.

16. A pulse train filter circuit as defined in claim 1, in which said regulating circuit (11) is constituted by a proportional regulator (33) and an integrating regulator (34) operating in series.

17. A pulse train filter circuit as defined in claim 16, in which means are provided including a smoothing circuit (28) with its input connected to the output of said proportional regulating circuit (33) for generating a direct current voltage signal that is proportional to the first derivative with respect to time of the input frequency ($f_1$).

18. A pulse train filter circuit as defined in claim 17, in which said smoothing circuit (28) comprises a low pass filter section (281, 282).

* * * * *